(12) United States Patent
Hein et al.

(10) Patent No.: US 6,351,167 B1
(45) Date of Patent: Feb. 26, 2002

(54) INTEGRATED CIRCUIT WITH A PHASE LOCKED LOOP

(75) Inventors: Thomas Hein; Thilo Marx; Patrick Heyne; Torsten Partsch, all of München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/608,563

(22) Filed: Jun. 30, 2000

(30) Foreign Application Priority Data

Jun. 30, 1999 (DE) .......................................... 199 30 167

(51) Int. Cl.$^7$ ................................................ H03L 7/00
(52) U.S. Cl. ...................................... 327/158; 327/158
(58) Field of Search ................................ 327/156, 158, 327/2, 3, 159, 147, 243, 161

(56) References Cited

U.S. PATENT DOCUMENTS 5,223,755 A * 6/1993 Richley ...................... 327/158
5,777,501 A   7/1998 AbouSeido .................. 327/274
5,990,715 A * 11/1999 Nikimura .................... 327/158

FOREIGN PATENT DOCUMENTS

| DE | 37 33 554 A1 | 4/1988 |
| DE | 197 03 986 A1 | 12/1997 |

* cited by examiner

*Primary Examiner*—Dinh T. Le
(74) *Attorney, Agent, or Firm*—Herbert L. Lerner; Laurence A. Greenberg; Werner H. Stemer

(57) ABSTRACT

A phase regulator is connected, on the input side, to the output of a phase comparator and generates a control signal in a manner dependent on the phase difference ascertained by said comparator. Updating of the control signal fed to a control input of a first delay unit is triggered by an edge of the first output clock signal occurring at the clock output of the first delay unit.

8 Claims, 2 Drawing Sheets

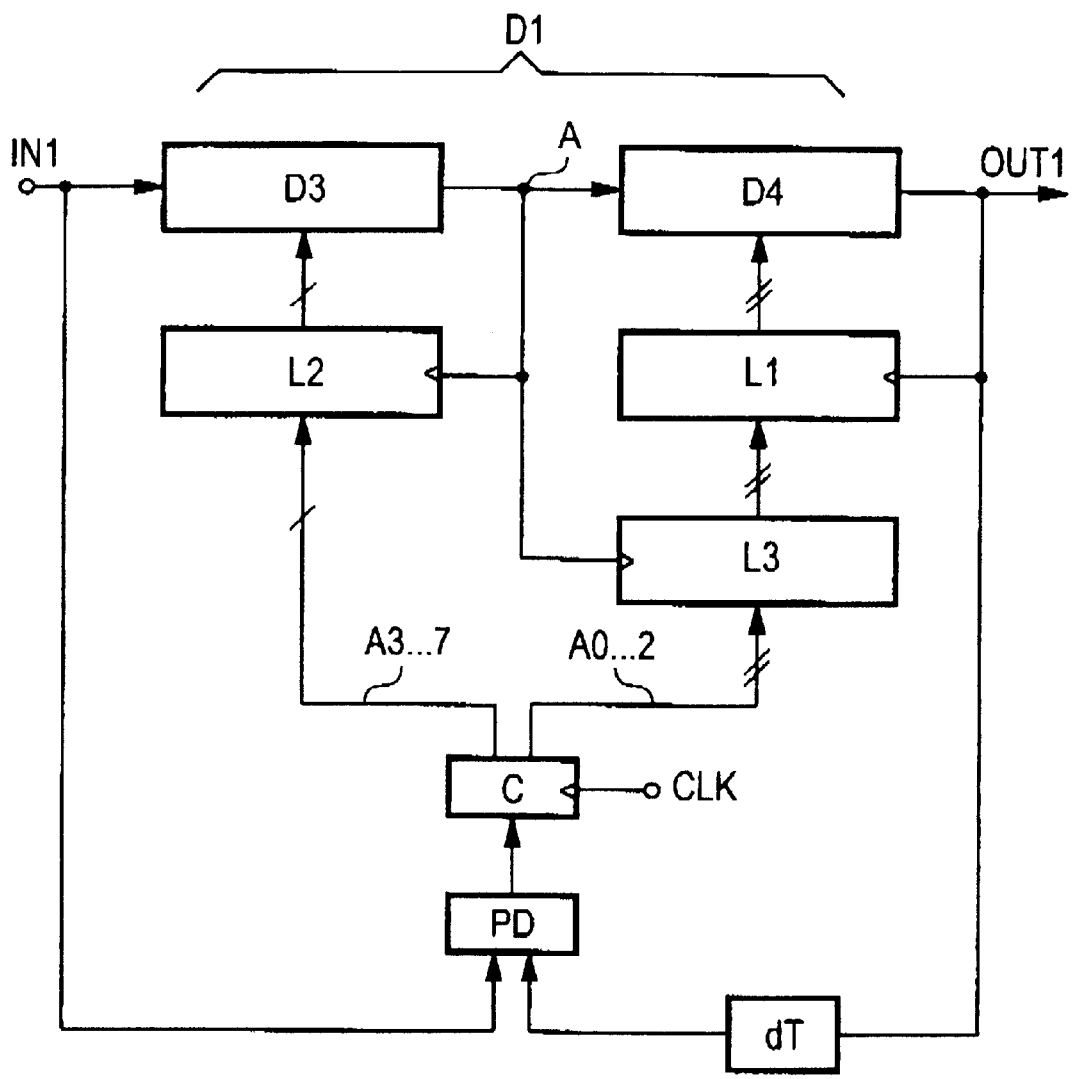

INTEGRATED CIRCUIT WITH A PHASE LOCKED LOOP

BACKGROUND OF THE INVENTION

FIELD OF THE INVENTION

The invention relates to an integrated circuit having a phase-locked loop.

Delay-Locked Loops (DLLs) are integrated circuits having a phase-locked loop in which an output clock signal is generated with a specific phase shift relative to an input clock signal. DLLs usually have a delay unit which is arranged between a clock input and a clock output and whose delay time is adjustable. The clock input for the input clock signal and the clock output for the output clock signal are connected to a phase comparator or phase detector. A phase regulator connected downstream of the phase detector generates a control signal which is used to set the delay time of the delay unit. The generation and updating of the control signal by the phase regulator are in this case often effected synchronously with a control clock signal.

Since edges of the output clock signal are critical for the driving of circuit units connected downstream of the DLL, it is desirable for these edges to be generated as far as possible without any disturbances. However, it can happen that the phase regulator clocked by the control signal performs adaptation or updating of the control signal fed to the delay unit shortly before or even during the occurrence of an edge of the output clock signal. This leads to the edges of the output clock signal being disturbingly influenced in an undesirable manner. The disturbance can be attributed to the fact that when there is a change in the control signal, a change is made to the delay time of the delay unit for which specific switching operations have to be carried out within the delay unit.

SUMMARY OF THE INVENTION

The invention is based on the object of specifying an integrated circuit of the type described in the introduction which avoids disturbances of the edges of the output clock signal on account of the updating of the control signal generated by the phase regulator.

This object is achieved by means of an integrated circuit in accordance with patent claim 1. The dependent claims relate to advantageous designs and developments of the invention.

According to the invention, updating of the control signal fed to the control input of the delay unit is triggered by an edge of the output clock signal occurring at the clock output.

By virtue of the fact that the updating of the control signal is triggered only by the edge of the output clock signal, it is no longer possible for the edge to be disturbingly influenced by the setting operations caused by the updating within the delay unit.

It has been customary hitherto for the phase regulator to be driven by a control clock signal which is independent of the output clock signal of the phase-locked loop. As a result, the control signal fed to the delay unit was updated independently of the output clock signal, so that the edges of the output clock signal could be disturbingly influenced.

According to a first embodiment of the invention, the dependence of the updating of the control signal on the output clock signal is achieved by the phase regulator being clocked by the output clock signal and not by a control clock signal independent thereof. For this purpose, a clock input of the phase regulator is connected to the clock output of the delay unit. The phase regulator then generates the updated values of the control signal in a manner dependent on the edges of the output clock signal.

According to another embodiment of the invention, the integrated circuit has a first transfer unit, which is arranged between the output of the phase regulator and the control input of the first delay unit and whose clock input is connected to the clock output of the first delay unit. The first transfer unit forwards the control signal fed to it by the phase regulator to the first delay unit in a manner dependent on the edge of the first output clock signal, which is fed to its clock input.

In this embodiment, it is possible for the phase regulator to be clocked by a control clock signal which remains independent of the output clock signal of the first delay unit. The first transfer unit, which may be, for example, a clocked holding circuit (latch), nevertheless ensures that the respective updated value of the control signal is forwarded to the control input of the first delay unit only after the occurrence of an edge of the output clock signal. Therefore, undesirable disturbances of edges of the output clock signal on account of alterations to the control signal generated by the phase regulator are avoided in this way as well.

According to one development of the invention, the integrated circuit has a second delay unit having a clock input for feeding in a second input clock signal, having a clock output for outputting a second output clock signal, which is delayed with respect to the second input clock signal, and having at least one control input for setting its delay time. The circuit further has a second transfer unit, via which the output of the phase regulator is connected to the control input of the second delay unit, which has a clock input connected to the clock output of the second delay unit, and which forwards the control signal fed to it by the phase regulator to the second delay unit in a manner dependent on the edge of the second output clock signal, which is fed to its control input.

In this development of the invention, therefore, the phase regulator serves both for regulating the phase shift of the first output clock signal with respect to the first input clock signal and for controlling the phase shift of the second output clock signal with respect to the second input clock signal. This development is particularly suitable for first and second input clock signals which are such that they have the same frequency and have a specific phase shift relative to one another. The second transfer unit ensures that the edges of the second output clock signal are also not disturbingly influenced by the updating of the control signal which is fed both to the first and to the second delay unit.

According to a further development of the invention, the first delay unit has a series circuit formed by a first delay stage and a second delay stage. The phase regulator serves for generating a control signal for the first delay stage and a control signal for the second delay stage. The phase regulator is connected to the first delay stage via a second transfer unit and to the second delay stage via a series circuit formed by a third transfer unit and the first transfer unit. Clock inputs of the second and third transfer units are connected to a clock output of the first delay stage.

The second and third transfer units ensure that the control signals which are generated at the same instant by the phase regulator are fed to the two delay stages during a period of the output clock signal. The second transfer unit prevents a disturbance of the edges of the output clock signal of the first delay stage and the first transfer unit prevents a disturbance of the edges of the output clock signal of the second delay stage by the updating of the respective control signal.

By way of example, the first delay stage may serve for the course setting of a delay time and the second delay stage may serve for the fine setting of a delay time of the first delay unit.

Other features which are considered as characteristic for the invention are set forth in the appended claims.

Although the invention is illustrated and described herein as embodied in an integrated circuit having a phase-locked loop, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

FIG. 3 is a block diagram of yet a further exemplary embodiment of the invention.

DESCRIPTION OF THE PREFERRED EMBODIMENTS

Figure 1:
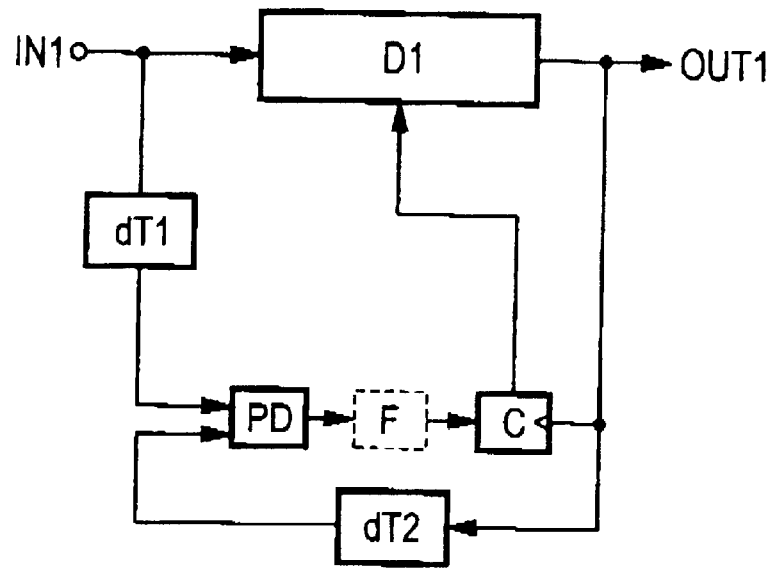
FIG. 1 is a block diagram of a first exemplary embodiment of the invention.
Figure 2:
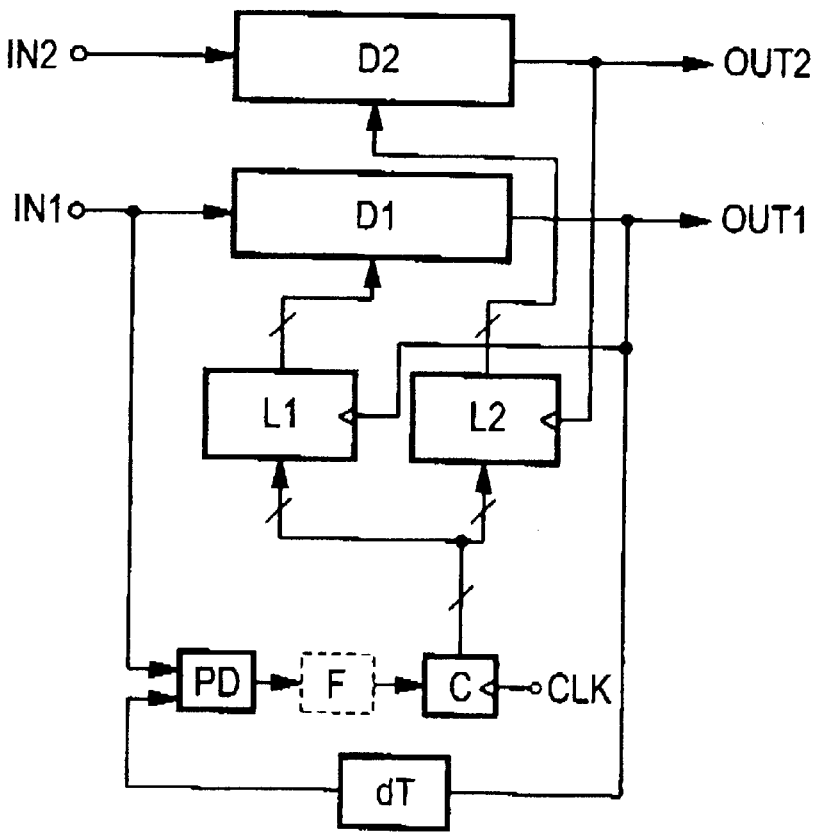
FIG. 2 is a block diagram of a further exemplary embodiment of the invention.

FIG. 1 shows a first exemplary embodiment of the invention, which has a first delay unit D1 having a clock input IN1 for feeding in a first input clock signal and having a clock output OUT1 for outputting a first output clock signal, which is delayed with respect to the first input clock signal. The clock input IN1 is connected to a first input of a phase detector PD via a first delay element dT1 having a constant or adjustable delay time. The clock output OUT1 is connected to a second input of the phase detector PD via a second delay element dT2 likewise having either a fixed or an adjustable delay time. In other exemplary embodiments of the invention, one of the two delay elements dT1, dT2 may also be omitted. In the exemplary embodiments as shown in FIG. 2 and FIG. 3, which will be explained further below, only one delay element dT of this type is arranged between the clock output and the second input of the phase detector PD, although in these exemplary embodiments, too, a further delay element can be provided between the clock input and the first input of the phase detector as an alternative or in addition to said delay element dT.

The phase detector PD in FIG. 1 checks the phase difference between the clock signals occurring at its two inputs and communicates a corresponding result signal, if appropriate via a filter unit F, to a phase regulator C. The phase regulator C generates a control signal which corresponds to the phase difference ascertained by the phase detector PD and is fed by said phase regulator to a control input of the first delay unit D1. The delay time of the first delay unit D1 can be set via its control unit.

The phase regulator C in FIG. 1 has an edge-sensitive clock input connected to the clock output OUT1 of the first delay unit D1. The phase regulator C carries out recalculations of the control signal that it generates, which are also referred to below as "updating" of the control signal, only upon each positive edge of the first output clock signal occurring at its clock input. In this case, it is assumed that the positive edge of the first output clock signal is the "active" edge thereof which is critical for the driving of circuit units (not illustrated in FIG. 1) connected downstream of the first clock output OUT1.

While the phase detector PD continuously updates the values of the phase difference that it ascertains and transfers them to the phase regulator C, the latter updates the control signal that it generates only when a positive edge occurs at its clock input. Consequently, a change in the control signal and hence a change in the delay time of the first delay unit D1 always take place immediately after the occurrence of the positive, active edge of the first output clock signal. Therefore, this prevents the updating of the control signal by the phase regulator C from influencing the active edge of the first output clock signal in an undesirable manner. Since only the active edge of the first output clock signal is critical for the driving of the circuit units that are connected downstream, a disturbance of the first output clock signal occurring shortly after the occurrence of the positive edge is not harmful.

FIG. 2 shows another exemplary embodiment of the invention, in which, in a departure from FIG. 1, the phase regulator C is not clocked by the first output clock signal at the clock output OUT1 of the first delay unit D1 but rather by a control clock signal CLK different from this. In this exemplary embodiment, the phase regulator C generates a digital control signal having a width of a plurality of bits. This signal is fed to corresponding control inputs of the first delay unit D1 via a first transfer unit L1, which is a clocked holding circuit (latch). The first transfer unit L1 has an edge-sensitive clock input connected to the clock output OUT1 of the first delay unit D1.

In this exemplary embodiment, therefore, the phase regulator C generates the control signal independently of the first output clock signal of the first delay unit D1. However, the first transfer unit L1 stores the present control signal generated by the phase regulator C in each case only when a positive edge of the first output clock signal occurs, and then forwards only this updated control signal to the first delay unit D1. Consequently, in this exemplary embodiment too, it is ensured that changes are made to the control signal at the control inputs of the first delay unit D1 only after the occurrence of the positive or active edge of the first output clock signal.

FIG. 2 reveals even further components, which can also be omitted in other exemplary embodiments of the invention. They include a second delay unit D2 having a clock input IN2 for feeding in a second input clock signal and having a clock output OUT2 for outputting a second output clock signal, which is delayed or phase-shifted with respect to the second input clock signal. The two input clock signals fed to the clock inputs IN1, IN2 have a fixed phase relationship relative to one another. One of the two input clock signals can be generated from the other by inversion, for example. The outputs of the phase regulator C at which the latter outputs the control signal are connected via a second transfer unit L2 to corresponding control inputs of the second delay unit D2 via which the delay time of the second delay unit D2 can be set. An edge-sensitive clock input of the second transfer unit L2 is connected to the clock output of the second delay unit D2.

In the case of the circuit shown in FIG. 2, the same control signal generated by the phase regulator C is fed both to the first transfer unit L1 and to the second transfer unit L2.

However, the updated control signal is forwarded by means of the first transfer unit L1 in a manner dependent on the first output clock signal of the first delay unit D1, and by means of the second transfer unit L2 in a manner dependent on the second output clock signal of the second delay unit D2. Consequently, it is ensured for both delay units D1, D2 that the positive edge of their output clock signals is not influenced in a disturbing manner by changes in the control signal at their control inputs. While the first delay unit D1 is part of the phase-locked loop having the phase regulator C, the control signal communicated from the phase regulator C via the second transfer unit L2 to the second delay unit D2 is used merely to effect control, that is to say not regulation, of the phase shift of the second output clock signal with respect to the second input clock signal.

FIG. 3 shows a further exemplary embodiment of the invention, in which the first delay unit D1 has a series circuit formed by a first delay stage D3 and a second delay stage D4. The phase regulator C once again generates a digital control signal, which has eight bits A0 to A7 in this example. The five most significant bits A3 to A7 of the control signal are fed to corresponding control inputs of the first delay stage D3 via a second transfer unit L2. The three least significant bits A0 to A2 of the control signal are fed to corresponding control inputs of the second delay stage D4 via a series circuit formed by a third transfer unit L3 and the first transfer unit L1. The delay times of the two delay stages D3, D4 can be set via their control inputs. In this case, the first delay stage D3 is a course delay stage and the second delay stage D4 is a fine delay stage of the first delay unit D1. This means that the delay time of the first delay stage D3 can be varied in minimal steps which are larger than those of the second delay stage D4.

The three transfer units L1, L2, L3 each have an edge-sensitive clock input. The clock inputs of the second transfer unit L2 and of the third transfer unit L3 are connected to a clock output A of the first delay stage D3, said clock output also being connected to a clock input of the second delay stage D4. The clock input of the first transfer unit L1 is once again connected to the clock output OUT1 of the first delay unit D1, said clock output being a clock output of the second delay stage D4.

In the case of the exemplary embodiment illustrated in FIG. 3, the control signal generated by the phase regulator is forwarded simultaneously via the second transfer unit L2 and the third transfer unit L3 to the control inputs of the first delay stage D3 and to the inputs of the first transfer unit L1. This ensures that positive edges at the clock output A of the first delay stage D3 are not influenced in a disturbing manner by updating of the control signal at the control inputs of the first delay stage D3. The first transfer unit L1 once again ensures that the control signal that it communicates to the control inputs of the second delay stage D4 is changed only after the occurrence of a positive edge of the first output clock signal.

[lacuna] store [lacuna] and forward [lacuna] to the control units of the corresponding delay stages D3, D4 until, when the next positive edge occurs at their clock input, they accept the control signal value present at their inputs at this instant and store it instead of the previously stored value and forward it to the delay stages D3, D4.

In all of the exemplary embodiments explained, the delay time of the delay units D1, D2 or delay stages D3, D4 is changed at a point in time which is noncritical and does not significantly disturb the corresponding output clock signal. In particular, the active edge (the positive edge in these exemplary embodiments) of said output clock signal is not disturbed. By virtue of the fact that the updating of the control signals at the control inputs of the delay units or delay stages is triggered immediately by the active edge of the output clock signals, the maximum possible amount of time of the period of the output clock signals is available to perform the change to the delay times which results from the updating before the next active edge occurs at the corresponding clock output. Consequently, the delay units D1, D2 and delay stages D3, D4 are already in the settled state when the next positive clock edge occurs.

In the case of the exemplary embodiment according to FIG. 3, the third transfer unit L3 ensures that the delay time of the second delay stage D4 is always changed after that of the first delay stage D3, but in the same clock period.

The transfer units L1, L2, L3 of the different exemplary embodiments are expediently arranged directly in the vicinity of the control inputs of the associated delay units D1, D2 or delay stages D3, D4, so that only negligible signal propagation times occur between their outputs and the control inputs.

The exemplary embodiment shown in FIG. 3 is particularly suitable if the two delay stages D3, D4 require, for setting a new delay time, amounts of time whose sum is greater than or equal to the period duration of the first input clock signal.

In other exemplary embodiments, the transfer units L1, L2, L3 may also be clocked by negative edges at their clock inputs if these are the active edges of the corresponding clock signals.

What is claimed is:
1. An integrated circuit, comprising:
a first delay unit having a clock input for receiving a first input clock signal, a clock output for outputting a first output clock signal, delayed with respect to the first input clock signal, and at least one control input for receiving a control signal setting a delay time of said first delay unit;
a phase detector having a first input connected to said clock input of said first delay unit, a second input connected to said clock output of said first delay unit, and an output;
a phase regulator having at least one input connected to said output of said phase comparator, at least one output connected to said control input of said first delay unit, for outputting a control signal dependent on a phase difference ascertained by said phase comparator; and
wherein the control signal fed to said control input of said first delay unit is updated by an edge of the first output clock signal at said clock output; and
wherein said phase regulator has a clock input connected to said clock output of said first delay unit, for calculating a present value of the control signal in dependence on signal edges present at said clock input thereof.
2. An integrated circuit, comprising:
a first delay unit having a clock input for receiving a first input clock signal, a clock output for outputting a first output clock signal, delayed with respect to the first input clock signal, and at least one control input for receiving a control signal setting a delay time of said first delay unit;
a phase detector having a first input connected to said clock input of said first delay unit, a second input connected to said clock output of said first delay unit, and an output; a phase regulator having at least one input connected to said output of said phase comparator, at least one output connected to said control input of said first delay unit, for outputting a control signal dependent on a phase difference ascertained by said phase comparator; and a first transfer unit connecting said output of said phase regulator to said control input of said first delay unit;

said first transfer unit having a clock input connected to said clock output of said first delay unit; and said first transfer unit having a control input and forwarding the control signal received from said phase regulator to said first delay unit in dependence on an edge of the first output clock signal present at said control input thereof;

wherein the control signal fed to said control input of said first delay unit is updated by an edge of the first output clock signal at said clock output.

3. The integrated circuit according to claim 2, which further comprises:

a second delay unit having a clock input for receiving a second input clock signal, a clock output for outputting a second output clock signal, delayed with respect to the second input clock signal, and at least one control input for setting a delay time of said second delay unit;

a second transfer unit connecting said output of said phase regulator to said control input of said second delay unit, said second transfer unit having a clock input connected to said clock output of said second delay unit;

said second transfer unit having a control input and forwarding the control signal received from said phase regulator to said second delay unit in dependence on an edge of the second output clock signal present at said control input thereof.

4. The integrated circuit according to claim 2, wherein said first delay unit includes, between said clock input and said clock output thereof, a series circuit formed by a first delay stage and a second delay stage, each having at least one control input for setting a respective delay time thereof;

said phase regulator has at least one first output for outputting a control signal for said first delay stage and at least one second output for outputting a control signal for said second delay stage;

said first transfer unit has an input and an output connected to said control input of said second delay stage;

a second transfer unit connects said first output of said phase regulator to said control input of said first delay stage;

said second transfer unit has a clock input connected to an output of said first delay stage; and said second transfer unit forwards the control signal received from said phase regulator to said first delay stage in dependence on an edge of an output clock signal of said first delay stage received at a control input thereof;

a third transfer unit connects said second output of said phase regulator to said input of said first transfer unit;

said third transfer unit has a clock input connected to said output of said first delay stage; and said third transfer unit forwards the control signal received from said phase regulator to said first transfer unit in dependence on the edge of the output clock signal of said first delay stage received at a control input thereof.

5. The integrated circuit according to claim 4, wherein said first delay stage is configured for a coarse setting of the delay time and said second delay stage is configured for a fine setting of the delay time of said first delay unit.

6. The integrated circuit according to claim 2, wherein said transfer unit is configured to store the control signals received between successive signal edges at said clock input thereof.

7. The integrated circuit according to claim 3, wherein at least one of said first transfer unit and said second transfer unit is configured to store the control signals received between successive signal edges at said clock input thereof.

8. The integrated circuit according to claim 4, wherein at least one of said first transfer unit and said second transfer unit is configured to store the control signals received between successive signal edges at said clock input thereof.

* * * * *

UNITED STATES PATENT AND TRADEMARK OFFICE
CERTIFICATE OF CORRECTION

PATENT NO. : 6,351,167 B1 Page 1 of 1
APPLICATION NO. : 09/608563
DATED : February 26, 2002
INVENTOR(S) : Thomas Hein et al.

It is certified that error appears in the above-identified patent and that said Letters Patent is hereby corrected as shown below:

Title page,

Item (57) ABSTRACT

Line 2 should read as follows:
  output of a phase detector and generates a control signal Line 4 should read as follows:
  by said detector. Updating of the control signal fed to a Column 6, line 46, should read as follows:
  said output of said phase detector, at least one output line 49 should read as follows:
  difference ascertained by said phase detector; and Column 7, line 3, should read as follows:
  detector, at least one output connected to said conline 6 should read as follows:
  said phase detector; and Signed and Sealed this Fourth Day of March, 2008

JON W. DUDAS
*Director of the United States Patent and Trademark Office*